(12) United States Patent
Wang et al.

(10) Patent No.: US 12,385,971 B2
(45) Date of Patent: Aug. 12, 2025

(54) VOLTAGE DETECTION DEVICE AND VOLTAGE PROTECTION METHOD

(71) Applicant: SigmaStar Technology Ltd., Fujian (CN)

(72) Inventors: Wei-Ping Wang, Taiwan (TW); Wei-Chih Cheng, Taiwan (TW); Yen-Ping Liu, Taiwan (TW)

(73) Assignee: SIGMASTAR TECHNOLOGY LTD., Fujian (CN)

( * ) Notice: Subject to any disclaimer, the term of this patent is extended or adjusted under 35 U.S.C. 154(b) by 160 days.

(21) Appl. No.: 18/498,217

(22) Filed: Oct. 31, 2023

(65) Prior Publication Data
US 2024/0168088 A1 May 23, 2024

(30) Foreign Application Priority Data

Nov. 14, 2022 (CN) .......................... 202211425947.8

(51) Int. Cl.
*G01R 31/30* (2006.01)
*G01R 15/04* (2006.01)
*G01R 17/02* (2006.01)
*G01R 19/165* (2006.01)

(52) U.S. Cl.
CPC ......... *G01R 31/3004* (2013.01); *G01R 15/04* (2013.01); *G01R 17/02* (2013.01); *G01R 19/16576* (2013.01)

(58) Field of Classification Search
CPC .. G01R 31/261; G01R 31/2623; G01R 21/06; G01R 19/30; G01R 19/00; G01R 15/144; G01R 15/12
See application file for complete search history.

(56) References Cited

U.S. PATENT DOCUMENTS 10,853,295 B2 * 12/2020 Pan ...................... G06F 13/4022
11,074,848 B2 *  7/2021 Ji ............................. G09G 3/20

* cited by examiner

*Primary Examiner* — Tung X Nguyen
(74) *Attorney, Agent, or Firm* — Edell, Shapiro & Finnan, LLC

(57) ABSTRACT

A voltage detection device includes a voltage divider circuit, a comparator circuit and a switch control circuit. The voltage divider circuit operates in a first mode based on a switching signal and divides a power voltage to generate an input voltage. The comparator circuit compares the input voltage with a set of reference voltages to generate a detection signal. The switch control circuit selectively adjusts a switching signal according to the detection signal after a predetermined period has elapsed from power-on of the power voltage so as to control the voltage divider circuit to switch from operating in the first mode to operating in a second mode. The first mode corresponds to a first target level of the power voltage, the second mode corresponds to a second target level of the power voltage, and the first target level is higher than the second target level.

12 Claims, 6 Drawing Sheets

# VOLTAGE DETECTION DEVICE AND VOLTAGE PROTECTION METHOD

This application claims the benefit of China application Serial No. CN202211425947.8, filed on Nov. 14, 2022, the subject matter of which is incorporated herein by reference.

BACKGROUND OF THE INVENTION

Field of the Invention

The present application relates to a voltage detection device, and more particularly to a voltage detection device and a voltage protection method capable of providing a system or a circuit with over-voltage protection during power-on of a power voltage.

Description of the Related Art

In certain applications, some circuits may use different voltage levels. For example, input/output (I/O) interface circuits need to be powered by voltages at different levels so as to correspondingly generate signals having different levels. In response to actual requirements, transistors having lower threshold voltages may be needed to implement circuits operable in high-voltage environments. Taking the above I/O interface circuits for example, in order to adapt to different voltage levels, these I/O interface circuits usually have multiple circuit configurations and an over-voltage protection mechanism, hence ensuring that these transistors are not damaged in high-voltage level operations. In the prior art, in order to set circuit configurations of I/O interface circuits, multiple voltage divider circuits and multiple comparators (respectively corresponding to different voltage levels) need to be used to determine whether a power voltage is at a high voltage level or a low voltage level. As a result, larger circuit areas and costs are required.

SUMMARY OF THE INVENTION

In some embodiments, it is an object of the present application to provide a voltage detection device and a voltage protection method, which are capable of providing voltage protection and automatically detecting a target level of a power voltage during power-on so as to overcome the issues of the prior art.

In some embodiments, a voltage detection device includes a voltage divider circuit, a comparator circuit and a switch control circuit. The voltage divider circuit operates in a first mode based on a switching signal and divides a power voltage to generate an input voltage. The comparator circuit compares the input voltage with a set of reference voltages to generate a detection signal. The switch control circuit selectively adjusts a switching signal according to the detection signal after a predetermined period has elapsed from power-on of the power voltage so as to control the voltage divider circuit to switch from operating in the first mode to operating in a second mode. The first mode corresponds to a first target level of the power voltage, the second mode corresponds to a second target level of the power voltage, and the first target level is higher than the second target level.

In some embodiments, a voltage protection method includes the following operations: controlling a voltage divider circuit to operate in a first mode based on a switching signal, and dividing a power voltage by the voltage divider circuit to generate an input voltage; comparing the input voltage with a set of reference voltages to generate a detection signal; and selectively adjusting the switching signal according to the detection signal after a predetermined period has elapsed from power-on the power voltage, so as to control the voltage divider circuit to switch from operating in the first mode to operating in a second mode; wherein the first mode corresponds to a first target level of the power voltage, the second mode corresponds to a second target level of the power voltage, and the first target level is higher than the second target level.

Features, implementations and effects of the present application are described in detail in preferred embodiments with the accompanying drawings below.

BRIEF DESCRIPTION OF THE DRAWINGS

To better describe the technical solution of the embodiments of the present application, drawings involved in the description of the embodiments are introduced below. It is apparent that, the drawings in the description below represent merely some embodiments of the present application, and other drawings apart from these drawings may also be obtained by a person skilled in the art without involving inventive skills.

DETAILED DESCRIPTION OF THE INVENTION

All terms used in the literature have commonly recognized meanings. Definitions of the terms in commonly used dictionaries and examples discussed in the disclosure of the present application are merely exemplary, and are not to be construed as limitations to the scope or the meanings of the present application. Similarly, the present application is not limited to the embodiments enumerated in the description of the application.

The term "coupled" or "connected" used in the literature refers to two or multiple elements being directly and physically or electrically in contact with each other, or indirectly and physically or electrically in contact with each other, and may also refer to two or more elements operating or acting with each other. As given in the literature, the term "circuit" may be a device connected by at least one transistor and/or at least one active element by a predetermined means so as to process signals.

Figure 1:
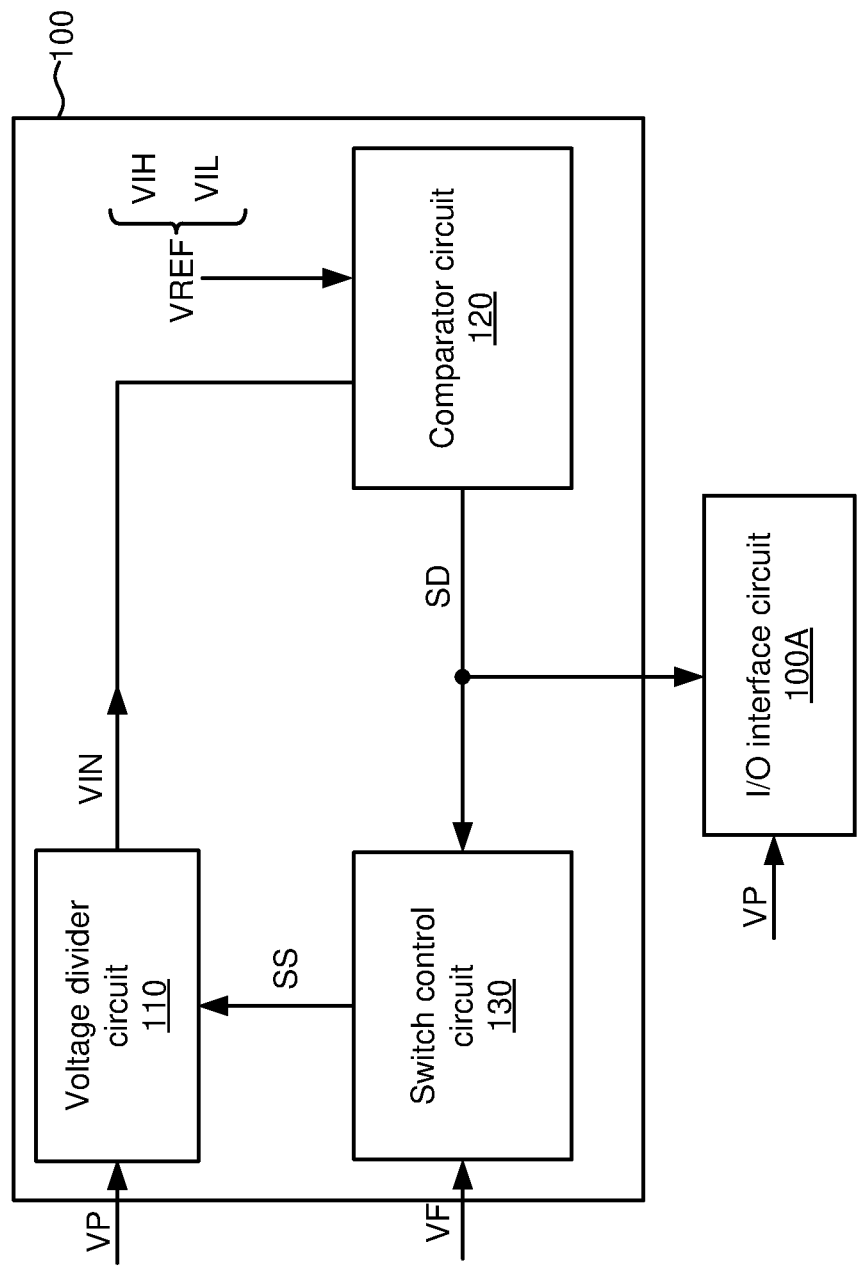
FIG. 1 is a schematic diagram of a voltage detection device according to some embodiments of the present application.

FIG. 1 shows a schematic diagram of a voltage detection device 100 according to some embodiments of the present application. In some embodiments, the voltage detection device 100 can detect whether a power voltage VP is at a first target level or a second target level (which is lower than the first target level), so as to correspondingly switch settings of associated circuits in a system, thereby preventing circuits in the system from damage caused by over-voltage. The power voltage VP may be used to drive, for example but not limited to, an input/output (I/O) interface circuit 100A. In different applications, a circuit configuration in the I/O interface circuit 100A may be set to a high-voltage mode (corresponding to the first target level) or a low-voltage mode (corresponding to the second target level). For example, if the power voltage VP is at the first target level (for example, 3.3 V), the I/O interface circuit 100A may operate in the high-voltage mode to output a signal having a higher level. In this case, an over-voltage protection mechanism in the I/O interface circuit 100A may be activated to protect transistors having lower threshold voltages. Or, if the power voltage VP is at the second target level (for example, 1.8 V), the I/O interface circuit 100A may operate in the low-voltage mode to output a signal having a lower level. In this case, an over-voltage protection mechanism in the I/O interface circuit 100A may be deactivated. In some embodiments, the I/O interface circuit 100A is a general-purpose input/output (GPIO) interface circuit.

The voltage detection device 100 includes a voltage divider circuit 110, a comparator circuit 120 and a switch control circuit 130. The voltage divider circuit 110 operates in a first mode (corresponding to the first target level) based on a switching signal SS and divides the power voltage VP to generate an input voltage VIN. As to be described below, the voltage divider circuit 110 further switches to a second mode (corresponding to the second target level) based on the switching signal SS. In the first and second modes different from each other, the voltage divider circuit 110 has different configurations, respectively, so as to divide the power voltage VP having different levels. For example, the voltage divider circuit 110 may include multiple resistors coupled in series, and one or more of these resistors may be variable resistors, of which resistance values are controlled by the switching signal SS. If the switching signal SS has a first logic value (for example, logic 1), the resistance values of the one or more variable resistors are correspondingly adjusted, so as to divide the power voltage VP having the first target level. Or, if the switching signal SS has a second logic value (for example, logic 0), the resistance values of the one or more variable resistors are correspondingly adjusted, so as to divide the power voltage VP having the second target level. In some embodiments, when the system is powered on or when the power voltage VP is powered on, the voltage divider circuit 110 is preset to operate in the first mode.

The comparator circuit 120 compares the input voltage VIN with a set of reference voltages VREF to generate a detection signal SD. For example, the set of reference signals VREF include a voltage VIN and a voltage VIL, wherein the voltage VIH is higher than the voltage VIL. If the input voltage VIN is higher than the voltage VIH, it means that the level of the power voltage VP has risen to the first or second target level and approximates a stable state. In this case, the detection signal SD has a first logic value (for example, logic 1). Or, if the input voltage VIN is lower than the voltage VIL, it means that the level of the power voltage VP is too low. In this case, the detection signal SD has a second logic value (for example, logic 0).

In some embodiments, the set of reference voltages VREF come from a reference voltage generator (not shown), which can selectively adjust the set of reference voltages VREF according to the switching signal SS. For example, if the switching signal SS has logic 1, the reference voltage generator can select the voltage VIH and the voltage VIL corresponding to the first target level as the set of reference voltages VREF. Or, if the switching signal SS has logic 0, the reference voltage generator can select the voltage VIH and the voltage VIL corresponding to the second target level as the set of reference voltages VREF.

The switch control circuit 130 selectively adjusts the switching signal SS according to the detection signal SD after a predetermined period has elapsed from power-on of the power voltage VP, so as to control the voltage divider circuit 110 from operating in the first mode to operating in the second mode. For example, the switch control circuit 130 may determine whether to adjust the switching signal SS according to a flag signal VF. The flag signal VF has a logic value (for example, logic 0) within the predetermined period, and switches to having another logic value (for example, logic 1) after the predetermined period has elapsed. Thus, the switch control circuit 130 may determine according to the flag signal VF whether the predetermined period has elapsed, so as to start determining according to the detection signal SD whether to adjust the switching signal SS. Within the predetermined period, the switch control circuit 130 does not adjust the switching signal SS, so that the voltage divider circuit 110 continues to operate in the first mode within the predetermined period. After the predetermined period has elapsed, if the detection signal SD indicates that the input voltage VIN is lower than the set of reference voltages VREF, the switch control circuit 130 adjusts the switching signal SS, so as to control the voltage divider circuit 110 to switch to operating in the second mode. Related operation details are to be described with reference to FIG. 2 or FIG. 5 below.

In some embodiments, the flag signal VF may be generated by a counter (not shown). For example, the counter may start counting after the system is powered on or after the power voltage VP is powered on, and the logic value of the flag signal VF is switched when the counter values is equal to a predetermined value (that is, after the predetermined period has elapsed). For example, within the predetermined period, the flag signal VF has logic 0; after the predetermined period has elapsed, the flag signal VF has logic 1. In some other embodiments, the flag signal VF may be generated based on control by software or firmware in the system. With the configurations above, once power-on the power voltage VP starts, the voltage divider circuit 110 continues to operate in the first mode (corresponding to the power voltage VP having a higher voltage level), and automatically selectively switches the operating mode of the voltage divider circuit 110 according to an actual level of the power voltage VP after a period of time has elapsed from the power-on. Thus, it is ensured that the voltage divider circuit 110 and the I/O interface circuit 100A operate by using a circuit configuration corresponding to a high level during the power-on of the power voltage VP, so as to prevent the power voltage VP from damaging transistors having low threshold voltages. In some embodiments, the time needed for the power voltage VP to rise to a target level may be determined by means of measurement or simulation, so as to set the time length of the predetermined period.

In related art, a voltage detection device needs to use multiple voltage divider circuits corresponding to multiple different target levels and multiple comparator so determine a circuit configuration to be used. With regard to the related art above, in some embodiments of the present application, the voltage detection device 100, by employing one comparator circuit 120 and one voltage divider circuit 110, uses timing control to determine a target level of the power voltage VP after the predetermined period has elapsed, and controls the voltage divider circuit 110 and the I/O interface circuit 100A to operate by using a circuit configuration corresponding to a high voltage during the power-on. As such, voltage protection is provided during the power-on, and switching to an appropriate operating mode according to an actual voltage level is carried out once the power-on is completed.

Figure 2:
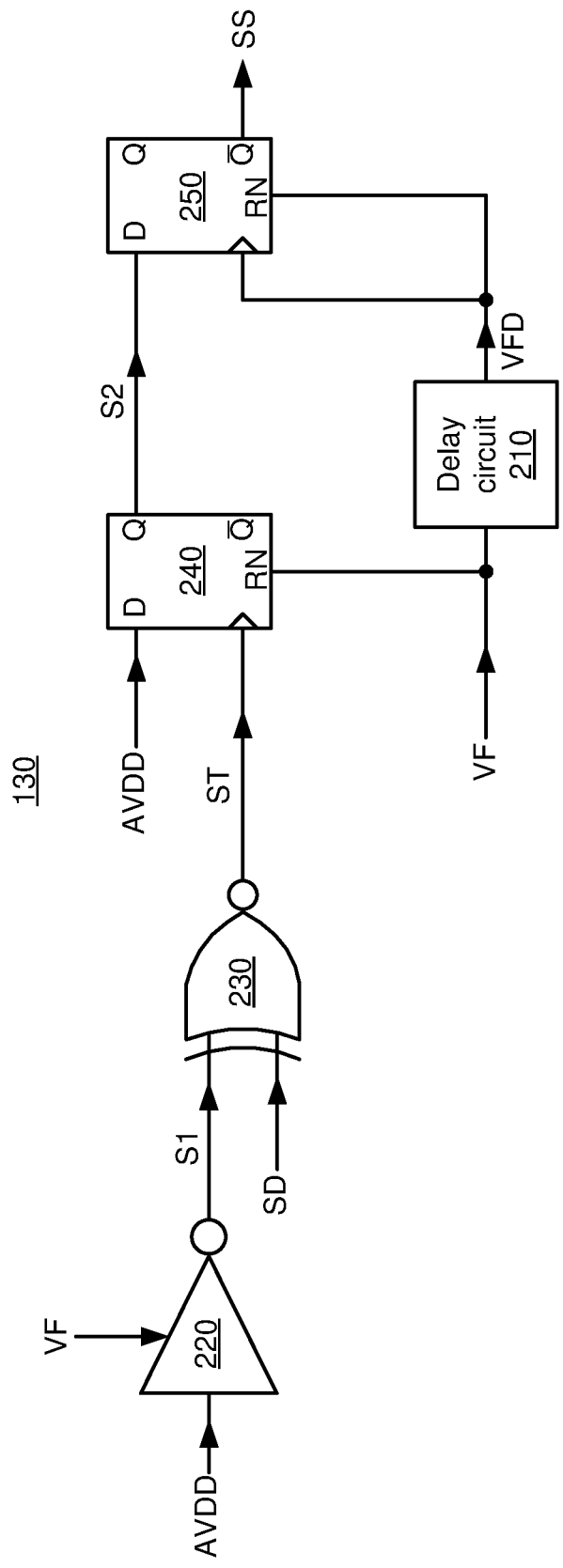
FIG. 2 is a schematic diagram of a switch control circuit in FIG. 1 according to some embodiments of the present application.

FIG. 2 shows a schematic diagram of the switch control circuit 130 in FIG. 1 according to some embodiments of the present application. The switch control circuit 130 includes a delay circuit 210, an inverter 220, a logic gate 230, a flip-flop 240 and a flip-flop 250. The delay circuit 210 generates a delay signal VFD according to the flag signal VF. In some embodiments, the delay circuit 210 may be a digital circuit that imports at least one gate delay and delays the delay flag signal VF to generate the delay signal VFD. The switch control circuit 130 may determine whether to adjust the switching signal SS according to the flag signal VF and the delay signal VFD.

The inverter 220 is selectively powered on according to the flag signal VF so as to generate a signal S1. For example, the inverter 220 may be an inverter having power gate control. When the flag signal VF is logic 0, the inverter 220 is not powered on and outputs the signal S1 having logic 1. Or, when the flag signal VF is logic 1, the inverter 220 is powered on and outputs the signal S1 having logic 0 according to a voltage AVDD. As described above, within the predetermined period from power-on of the power voltage VP, the flag signal VF has logic 0. In other words, within the predetermined period, the inverter 220 may continuously output the signal S1 having logic 1. On the other hand, after the predetermined period has elapsed, the flag signal VF switches to having logic 1. Thus, after the predetermined period has elapsed, the inverter 220 outputs the signal S1 having logic 0.

The logic gate 230 generates a trigger signal ST according to the detection signal SD and the signal S1. In some embodiments, the logic gate 230 may be an XNOR gate. As described above, after the predetermined period has elapsed, the inverter 220 outputs the signal S1 having logic 0. If the input voltage VIN is lower than the set of reference voltages VREF after the predetermined period has elapsed, the detection signal SD has logic 0. In this case, it means that the power voltage VD is at the second target level that is lower. Thus, the logic gate 230 may output the trigger signal ST having logic 1 to trigger the flip-flop 240 to operate, so as to adjust the switching signal SS. Or, if the input voltage VIN is still higher than the set of reference voltages VREF after predetermined period has elapsed, the detection signal SD has logic 1. In this case, it means that the power voltage VP is at the first target level that is higher. Thus, the logic gate 230 may continuously output the trigger signal ST having logic 0 and hence does not adjust the switching signal SS.

The flip-flop 240 outputs the voltage AVDD as a signal S2 according to the trigger signal ST, and is reset according to the flag signal VF. The flip-flop 250 is coupled to the flip-flop 240, outputs the switching signal SS according to the delay signal VFD and the signal S2, and is reset according to the delay signal VFD, wherein the logic value of the switching signal SS is opposite to the logic value of the signal S2. For example, each of the flip-flop 240 and the flip-flop 250 is a D-flip-flop having a reset terminal (denoted as RN). The reset terminal of the flip-flop 240 receives the flag signal VF, and the reset terminal and a receiving terminal of the flip-flop 250 receive the delay signal VFD. As such, each of the flip-flop 240 and the flip-flop 250 is reset within the predetermined period, such that the signal S2 and the switching signal SS have fixed levels. For example, the signal S2 continues to have logic 0 within the predetermined period, and the switching signal SS continues to have logic 1 within the predetermined period. A data input terminal (denoted as D) of the flip-flop 250 receives the signal S2, and an output terminal (denoted as QN) of the flip-flop 250 outputs the switching signal SS, such that the logic value of the switching signal SS is opposite to the logic value of the signal S2.

With the configuration above, within the predetermined period from power-on of the power voltage VP, the flip-flop 240 and the flip-flop 250 are reset based on the flag signal VF, thereby resetting internal signals to predetermined levels. As such, the switching signal SS is kept unchanged within the predetermined period (that is, the flip-flop 250 is caused to continuously output the switching signal SS having logic 1), so as to keep the voltage divider circuit 110 to continue to operate in a first mode corresponding to the first target level that is higher. After the predetermined period has elapsed, the flag signal VF switches to having logic 1, such that the flip-flop 240 and the flip-flop 250 are no longer reset. In this case, if the trigger signal ST undergoes transition (for example, switching from logic 0 to logic 1), the flip-flop 240 may output the voltage AVDD as the signal S2, and the flip-flop 250 may generate the switching signal SS having logic 0 according to the signal S2 and the delay signal VFD, so as to control the voltage divider circuit 110 to operate in the second mode corresponding to the second target level that is lower. Or, if the trigger signal ST does not undergo transition, the flip-flop 250 may continuously output the switching signal SS having logic 1, such that the voltage divider circuit 110 continues to operate in the first mode.

Figure 3:
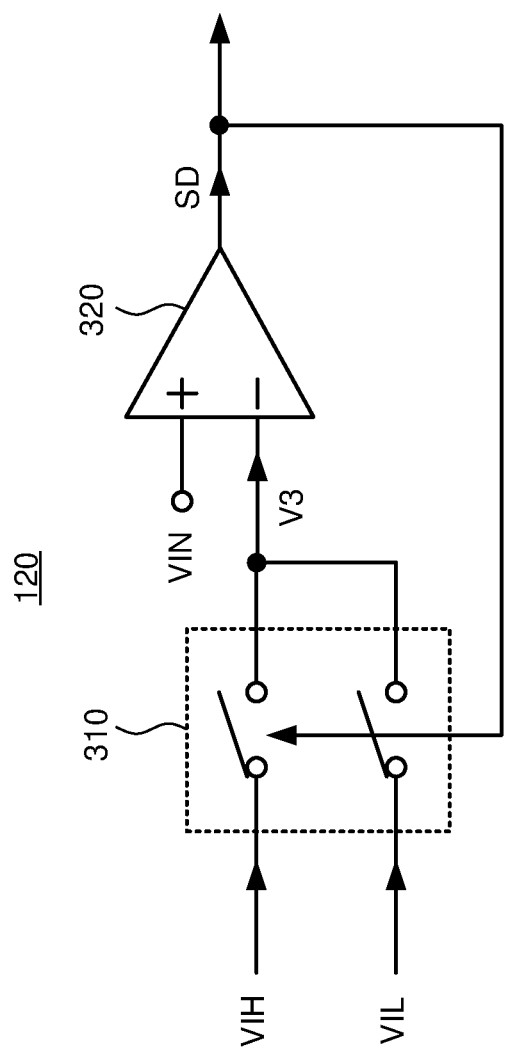
FIG. 3 is a schematic diagram of a comparator circuit in FIG. 1 according to some embodiments of the present application.

FIG. 3 shows a schematic diagram of the comparator circuit 120 in FIG. 1 according to some embodiments of the present application. The comparator circuit 120 includes a multiplexer 310 and a comparator 320. The multiplexer 310 selectively outputs one of the voltage VIH and the voltage VIL as a voltage V3 according to the detection signal SD. For example, the multiplexer 310 includes a first switch and a second switch. When the detection signal SD has a low level (or example, logic 0), the first switch is turned on so as to output the voltage VIH as the voltage V3. Or, when the detection signal SD has a high level (or example, logic 1), the second switch is turned on so as to output the voltage VIL as the voltage V3. The comparator 320 compares the input voltage VIN with the voltage V3 to generate the detection signal SD. As such, the detection signal SD may have a high level when the input voltage VIN is higher than the voltage VIH. Or, the detection signal SD may have a low level when the input voltage VIN is lower than the voltage VIL.

Figure 4:
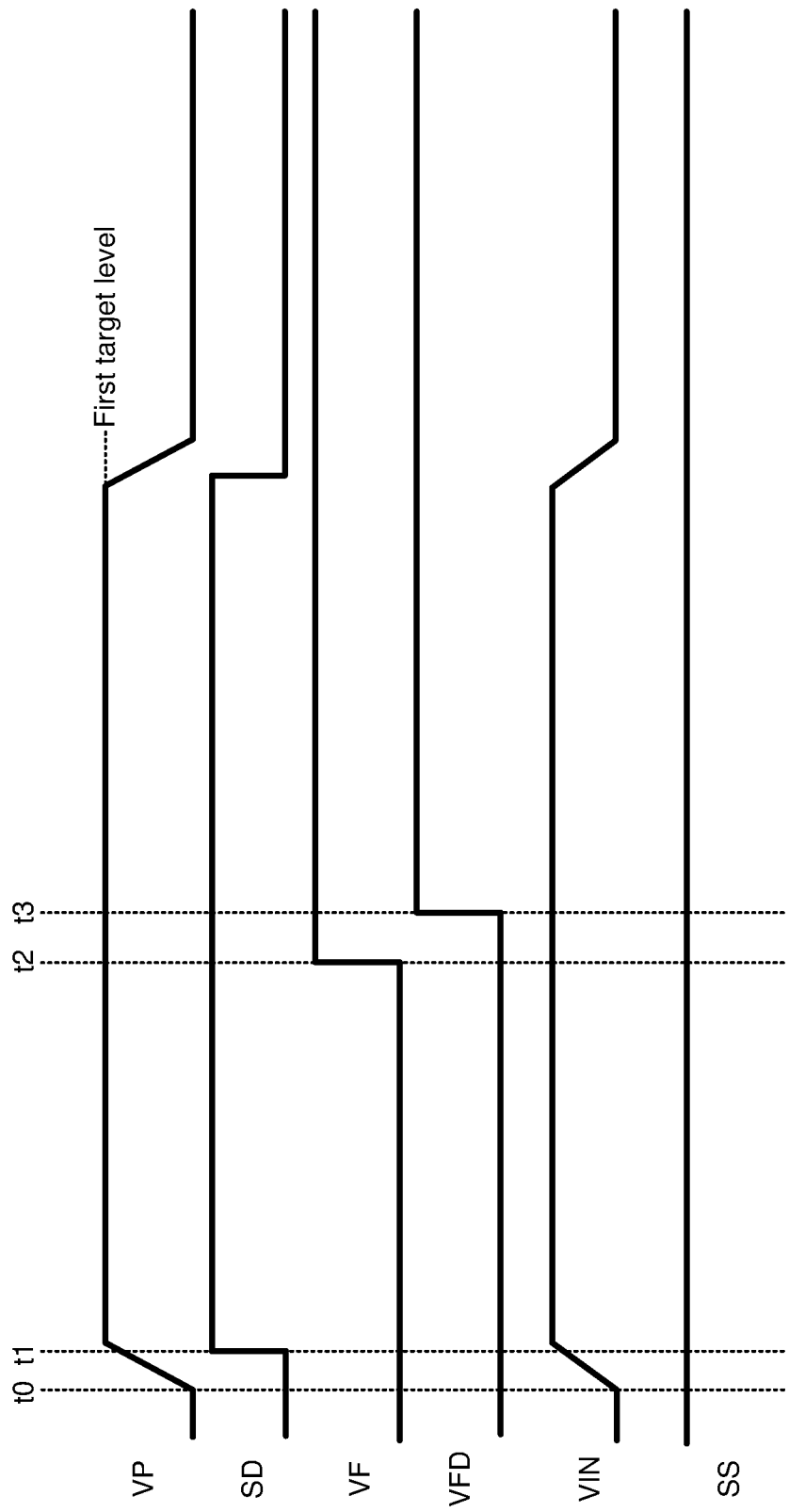
FIG. 4 is a waveform diagram of part of signals in the voltage detection device in FIG. 1 according to some embodiments of the present application.

FIG. 4 shows a waveform diagram of part of signals in the voltage detection device in FIG. 1 according to some embodiments of the present application. In the example in FIG. 4, the power voltage VP is configured to have the first target level. That is, the power voltage VP rises to a higher level (for example but not limited to, 3.3 V) during power-on. At a timing t0, power-on of the power voltage VP starts, and the voltage divider circuit 110 operates in the first mode corresponding to the first target level according to the switching signal SS to divide the power voltage VP, so as to generate the input voltage VIN. At a timing t1, the power voltage VP reaches the first target level, such that the detection signal SD switches to having logic 1. At a timing t2, the predetermined period (for example, a period between the timing t0 and the timing t2) has elapsed, such that the flap signal VF switches from having logic 0 to having logic 1. At a timing t3, the delay signal VFD also switches from having logic 0 to having logic 1. Since the power voltage VP is stably at the first level, the detection signal SD after the predetermined period has elapsed still continues to have logic 1. In this case, the switch control circuit 130 determines that the power voltage VP is at the first target level that is higher and hence does not adjust the switching signal SS. Thus, the voltage divider circuit 110 and the I/O interface circuit 100A are kept to operate in a high-voltage mode.

Figure 5:
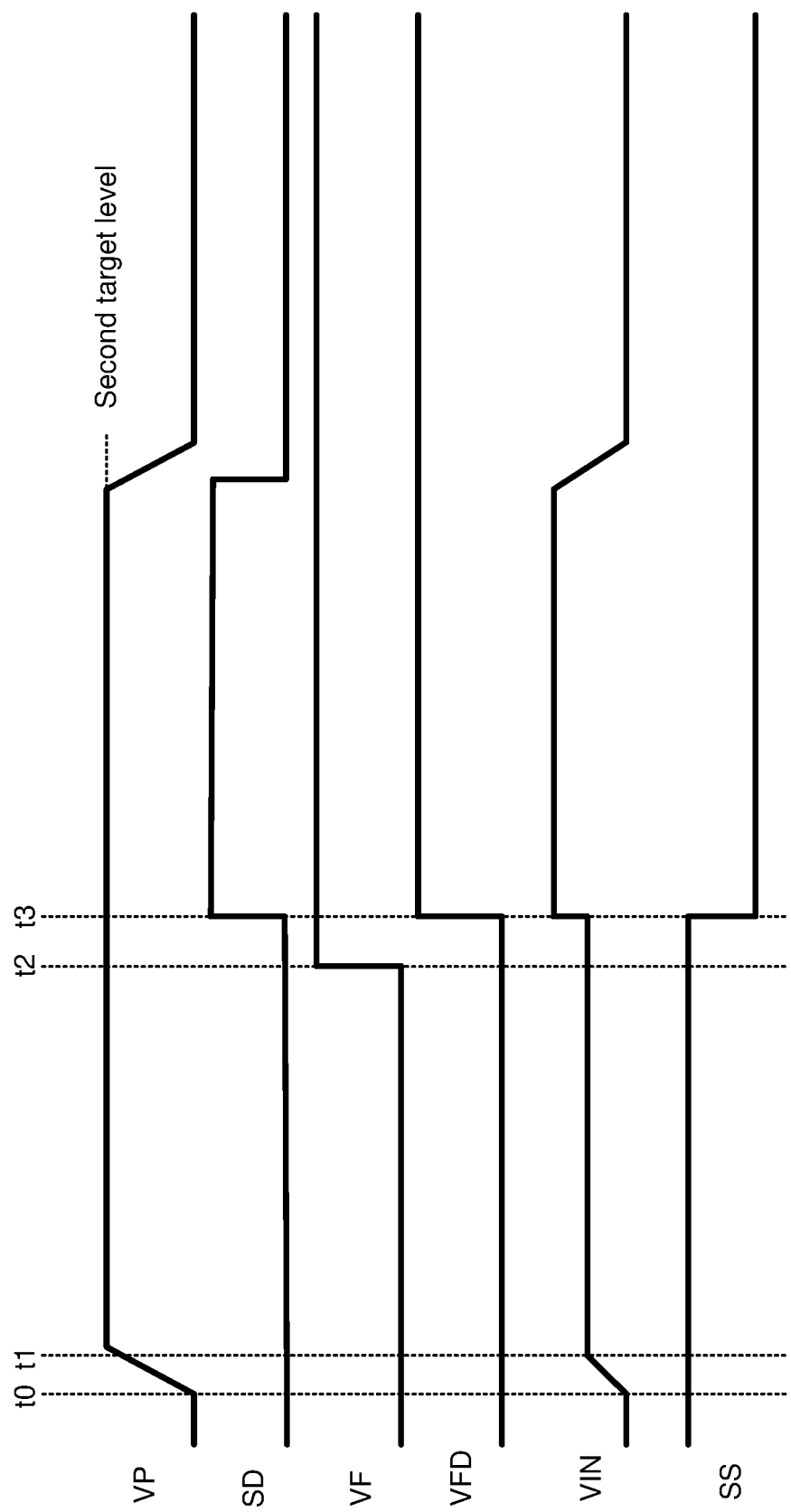
FIG. 5 is a waveform diagram of part of signals in FIG. 1 according to some embodiments of the present application.

FIG. 5 shows a waveform diagram of part of signals in the voltage detection device in FIG. 1 according to some embodiments of the present application. In the example in FIG. 5, the power voltage VP is configured to have the second target level. That is, the power voltage VP rises to a lower level (for example but not limited to, 1.8 V) during power-on. At a timing to, power-on of the power voltage VP starts, and the voltage divider circuit 110 operates in the first mode corresponding to the first target level that is higher according to the switching signal SS to divide the power voltage VP, so as to generate the input voltage VIN. At a timing t1, the power voltage VP reaches the second target level. However, since the voltage divider circuit 110 operates in the first mode, the detection signal SD has logic 0. At a timing t2, the predetermined period (for example, a period between the timing t0 and the timing t2) has elapsed, such that the flap signal VF switches from having logic 0 to having logic 1. At a timing t3, the delay signal VFD also switches from having logic 0 to having logic 1. Since the power voltage VP is at the second level that is lower, the detection signal SD after the predetermined period has elapsed has logic 0. In this case, the switch control circuit 130 determines that the power voltage VP is at the second target level that is lower and hence adjusts the switching signal SS from having logic 1 to having logic 0. The voltage divider circuit 110 may switch to operating in the second mode corresponding to the second target level based on the switching signal SS, so as to generate the input voltage VIN that is higher. As such, the comparator circuit 120 may generate the detection signal SD having logic 1. Accordingly, the comparator circuit 120 determines that the power voltage VP is stable at the second target level, and hence controls the I/O interface circuit 100A to switch to operating in a low-voltage mode.

Figure 6:
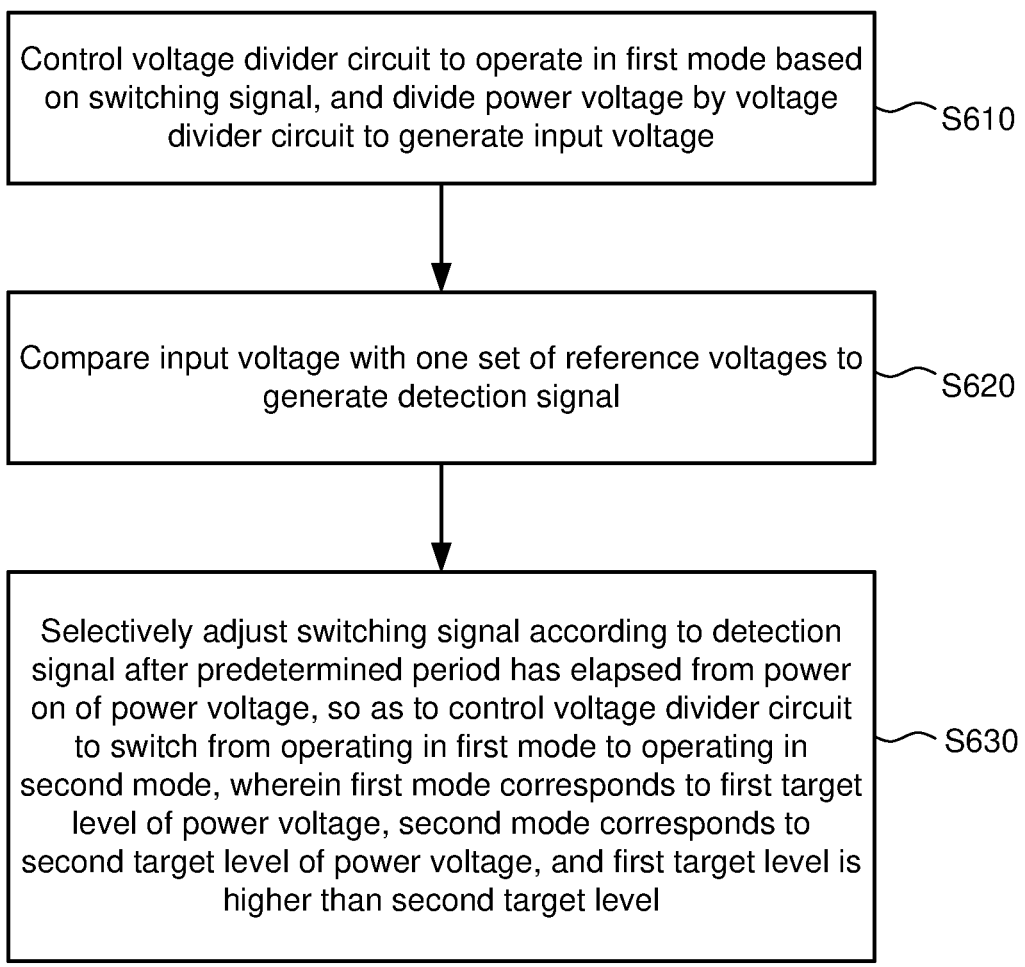
FIG. 6 is a flowchart of a voltage protection method according to some embodiments of the present application.

FIG. 6 shows a flowchart of a voltage protection method 600 according to some embodiments of the present application. In operation S610, a voltage divider circuit is controlled to operate in a first mode based on a switching signal, and a power voltage is divided by the voltage divider circuit to generate an input voltage. In operation S620, the input voltage is compared with a set of reference voltages to generate a detection signal. In operation S630, the switching signal is selectively adjusted according to the detection signal after a predetermined period has elapsed from power-on of the power voltage so as to control the voltage divider circuit to switch from operating in the first mode to operating in a second mode. The first mode corresponds to a first target level of the power voltage, the second mode corresponds to a second target level of the power voltage, and the first target level is higher than the second target level.

The details of the plurality of operations above may be referred from the description associated with the foregoing embodiments, and are omitted herein for brevity. The plurality operations of the voltage protection method 600 above are merely examples, and are not limited to being performed in the order specified in these examples. Without departing from the operation means and ranges of the various embodiments of the present application, additions, replacements, substitutions or omissions may be made to the operations of the voltage protection method 600, or the operations may be performed in different orders (for example, simultaneously performed or partially simultaneously performed).

In conclusion, the voltage detection device and the voltage protection method according to some embodiments of the present application, by employing one comparator circuit and one voltage divider circuit in coordination with timing control, keep a circuit configuration and operations in a high-voltage mode during power-on of a power voltage, and automatically detect a target level of the power voltage so as to automatically switch the circuit configuration after the power-on is completed. As such, it is ensured that the voltage detection device and circuits to be driven are not damaged by over-voltage during power-on, and switching to an appropriate circuit configuration is automatically carried out after the power-on is completed.

While the present application has been described by way of example and in terms of the preferred embodiments, it is to be understood that the disclosure is not limited thereto. Various modifications made be made to the technical features of the present application by a person skilled in the art on the basis of the explicit or implicit disclosures of the present application. The scope of the appended claims of the present application therefore should be accorded with the broadest interpretation so as to encompass all such modifications.

What is claimed is:

1. A voltage detection device, comprising:
a voltage divider circuit, operating in a first mode based on a switching signal and dividing a power voltage to generate an input voltage;
a comparator circuit, comparing the input voltage and a set of reference voltages to generate a detection signal; and
a switch control circuit, selectively adjusting the switching signal according to the detection signal after a predetermined period has elapsed from power-on of the power voltage, so as to control the voltage divider circuit from operating in the first mode to operating in a second mode;
wherein the first mode corresponds to a first target level of the power voltage, the second mode corresponds to a second target level of the power voltage, and the first target level is higher than the second target level.

2. The voltage detection device according to claim 1, the switch control circuit does not adjust the switching signal within the predetermined period, so that the voltage divider circuit continues to operate in the first mode within the predetermined period.

3. The voltage detection device according to claim 1, wherein if the detection signal indicates that the input voltage is lower than the set of reference voltages after the predetermined period has elapsed, the switch control circuit adjusts the switching signal to control the voltage divider circuit to switch to operating in the second mode.

4. The voltage detection device according to claim 1, wherein the switch control circuit further determines whether to adjust the switching signal according to a flag signal and a delay signal of the flag signal.

5. The voltage detection device according to claim 4, wherein the flag signal has a first logic value within the predetermined period, and switches to having a second logic value after the predetermined period has elapsed.

6. The voltage detection device according to claim 1, wherein the switch control circuit comprises:
- a delay circuit, generating a delay signal according to a flag signal;
- an inverter, selectively powered on according to the flag signal to generate a first signal;
- a logic gate, generating a trigger signal according to the detection signal and the first signal;
- a first flip-flop, outputting a voltage as a second signal according to the trigger signal, and being reset according to the flag signal; and
- a second flip-flop, outputting the switching signal according to the trigger signal and the second signal, and being reset according to the delay signal.

7. The voltage detection device according to claim 6, wherein the first flip-flop and the second flip-flop are reset within the predetermined period so as to keep the switching signal unchanged.

8. The voltage detection device according to claim 6, wherein a logic value of the switching signal is opposite to a logic value of the second signal.

9. The voltage detection device according to claim 1, wherein the comparator circuit comprises:
- a multiplexer, outputting one of a first voltage and a second voltage in the set of reference voltages as a third voltage according to the detection signal; and
- a comparator, comparing the input voltage with the third voltage to generate the detection signal.

10. The voltage detection device according to claim 1, wherein the power voltage is used to drive an input/output (I/O) interface circuit.

11. A voltage protection method, comprising:
- controlling a voltage divider circuit to operate in a first mode based on a switching signal, and dividing a power voltage by the voltage divider circuit to generate an input voltage;
- comparing the input voltage with a set of reference voltages to generate a detection signal; and
- selectively adjusting the switching signal according to the detection signal after a predetermined period has elapsed from power-on of the power voltage, so as to control the voltage divider circuit to switch from operating in the first mode to operating in a second mode;
- wherein the first mode corresponds to a first target level of the power voltage, the second mode corresponds to a second target level of the power voltage, and the first target level is higher than the second target level.

12. The voltage protection method according to claim 11, wherein if the detection signal indicates that the input voltage is lower than the set of reference voltages after the predetermined period has elapsed, the switching signal is adjusted to control the voltage divider circuit to switch to operating in the second mode.

* * * * *